(12) United States Patent
Chen et al.

(10) Patent No.: US 10,157,773 B1
(45) Date of Patent: Dec. 18, 2018

(54) SEMICONDUCTOR STRUCTURE HAVING LAYER WITH RE-ENTRANT PROFILE AND METHOD OF FORMING THE SAME

(71) Applicant: TAIWAN SEMICONDUCTOR MANUFACTURING CO., LTD., Hsinchu (TW)

(72) Inventors: Yi-Shan Chen, Tainan (TW); Chan-Syun David Yang, Taipei (TW); Li-Te Lin, Hsinchu (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/823,687

(22) Filed: Nov. 28, 2017

(51) Int. Cl.
| | |
|---|---|
| *H01L 21/44* | (2006.01) |
| *H01L 21/768* | (2006.01) |
| *H01L 21/311* | (2006.01) |
| *H01L 21/033* | (2006.01) |
| *H01L 23/528* | (2006.01) |
| *H01L 21/32* | (2006.01) |
| *H01L 21/02* | (2006.01) |

(52) U.S. Cl.
CPC .... *H01L 21/76804* (2013.01); *H01L 21/0331* (2013.01); *H01L 21/0337* (2013.01); *H01L 21/31122* (2013.01); *H01L 21/31144* (2013.01); *H01L 21/32* (2013.01); *H01L 23/5283* (2013.01); *H01L 21/02115* (2013.01); *H01L 21/02282* (2013.01); *H01L 21/0332* (2013.01)

(58) Field of Classification Search
CPC ......... H01L 21/76804; H01L 21/02115; H01L 21/0337; H01L 21/31122; H01L 21/31144; H01L 21/32
USPC .................................................. 438/672–675
See application file for complete search history.

(56) References Cited

U.S. PATENT DOCUMENTS

| | | | |
|---|---|---|---|
| 8,431,486 B2* | 4/2013 | Cabral, Jr. | H01L 21/31116 257/E21.582 |
| 8,883,028 B2* | 11/2014 | Kanarik | H01J 37/32082 216/68 |
| 2004/0110375 A1* | 6/2004 | Chen | H01L 21/28185 438/689 |
| 2012/0038056 A1* | 2/2012 | Cabral, Jr. | H01L 21/31116 257/774 |
| 2015/0236159 A1* | 8/2015 | He | H01L 29/66795 257/401 |
| 2017/0069462 A1* | 3/2017 | Kanarik | H01J 37/321 |
| 2017/0140931 A1* | 5/2017 | Van Cleemput | H01L 21/02126 |

* cited by examiner

*Primary Examiner* — Nitin Parekh
(74) *Attorney, Agent, or Firm* — McClure, Qualey & Rodack, LLP

(57) ABSTRACT

A method of forming a semiconductor structure is provided. In this method, a semiconductor substrate is provided. A SoC layer is formed on the semiconductor substrate. A hard mask layer is formed over the SoC layer. The hard mask layer is patterned to expose a portion of the SoC layer. At least one opening is formed on the portion of the SoC layer using an ALE operation, thereby enabling the remaining portion of the SoC layer adjacent to the at least one opening to have a re-entrant angle included between a sidewall of the SoC layer and a bottom of the SoC layer.

20 Claims, 12 Drawing Sheets

SEMICONDUCTOR STRUCTURE HAVING LAYER WITH RE-ENTRANT PROFILE AND METHOD OF FORMING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

A metal-filling operation is a common and widely used operation to form a semiconductor device. However, with decreasing in a dimension of a semiconductor structure and increasing in an aspect ratio of the semiconductor structure, challenges in the metal-filling operation become more and more significant. A solution tackles the encountered problems is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
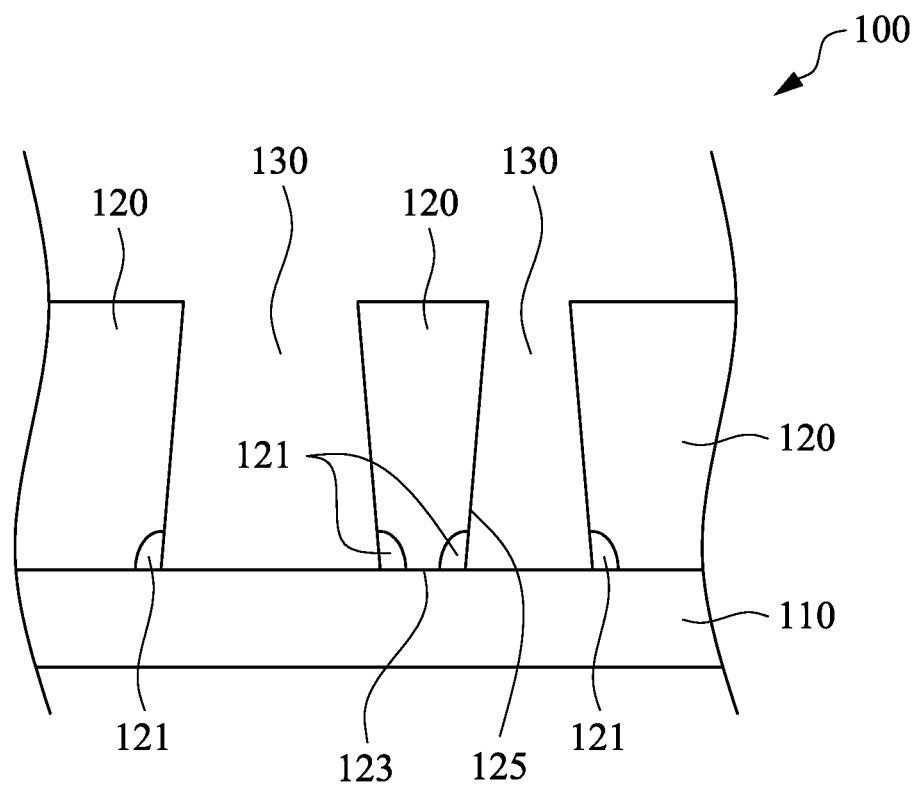
FIG. 1 is a schematic cross-sectional view of a semiconductor structure having a SoC (spin on carbon) layer with a re-entrant profile.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term of "profile" in the present disclosure refers to a cross-sectional shape of a layer or an opening.

The term of "taper profile" in the present disclosure refers to a profile having a smaller top and a wider bottom (i.e. a trapezoid shape), so that an included angle between the bottom and a sidewall of the profile is less than 90°.

The term of "re-entrant profile" in the present disclosure refers to a profile having a wider top and a smaller bottom (i.e. an inverted trapezoid shape), so that an included angle (hereinafter as a re-entrant angle) between the bottom and a sidewall of the profile is greater than 90°.

Typically, a spin on carbon (SoC) layer is etched by a drying etching operation using a hard mask layer formed over the SoC layer, so as to form an opening in which a dielectric material is filled, and then the remaining portion of the SoC layer is removed to form a space for filling a metal material therein. The hard mask layer may include a sacrificial (SAC) silicon nitride layer and an oxide hardmask layer to cover at least one portion of a low k spacer layer under the hardmask layer. The opening may have a re-entrant profile causing the remaining portion of the SoC layer to have a taper profile after the dry etching operation because a reactive gas cannot easily enter a bottom of the opening due to a small dimension and a high aspect ratio of the semiconductor structure. Compared to the dielectric material, filling the metal material into such space (also with a taper profile) formed after removing the remaining portion of the SoC layer with the taper profile is much more challenging due to limitations of the metal-filling operation. Since the taper profile of the SoC layer is caused by a low bias voltage, the bias has to be increased to obtain a more vertical profile of the SoC layer. However, the increased bias is likely to damage the hard mask layer, thus leading to insufficient selectivity to the hardmask layer and the low k spacer layer when the SoC layer is being etched. In addition, since the chemical etching causes a lateral etching and inconsistent etching/deposition rates between different spaces having different dimensions, it is difficult to control profile loading, thus causing an undesired bowing profile and less reliability of a semiconductor structure formed thereby.

Embodiments of the present disclosure are directed to providing a semiconductor structure having a layer (a SoC layer or a metal layer) with a re-entrant profile and a method of forming the semiconductor structure. In general, the method of the present disclosure applying an atomic layer etching (ALE) operation to the SoC layer of the semiconductor structure, in which a plurality cycles of an etching operation are involved and a flow rate of the reactive gas, a pressure and a temperature of the reaction are changed gradually to form the re-entrant profile of the semiconductor structure. In other words, the ALE operation of the present disclosure helps to form the opening having the taper profile, so as to obtain the SoC layer having the re-entrant profile. The method may further include formation of the metal layer with the re-entrant profile by removing the SoC layer with the re-entrant profile and forming the space to fill in the metal material. The re-entrant profile of the SoC layer benefits a metal-filling operation, and the bowing profile of the semiconductor structure may be avoided. Besides, etching the SoC layer by the ALE operation has a high selectivity (e.g. selectivity greater than 70) to the SAC silicon nitride layer, the oxide hard mask layer and the low k spacer layer, which can prevent a gate loss when the semiconductor structure is applied to manufacture a semiconductor device, for example, a fin field effect transistor (FinFET) device.

Referring to FIG. 1, FIG. 1 is a schematic cross-sectional view of a semiconductor structure having a SoC layer with a re-entrant profile. In FIG. 1, a semiconductor structure 100 includes a semiconductor substrate 110, a SoC layer 120, and at least one opening 130. The SoC layer 120 is disposed on the semiconductor substrate 110, and the openings 130 are disposed in the SoC layer 120. In the embodiment of FIG. 1, two openings with different dimensions are shown, however, other numbers and other dimensions of the openings may be applied in other embodiments. The openings 130 are in a shape of trapezoid, and the SoC layer 120 adjacent to the openings 130 may have the re-entrant profile (i.e. an angle 121 included between a bottom 123 of the SoC layer 120 and a sidewall 125 of the SoC layer 120 is greater than 90°).

Figure 2A:
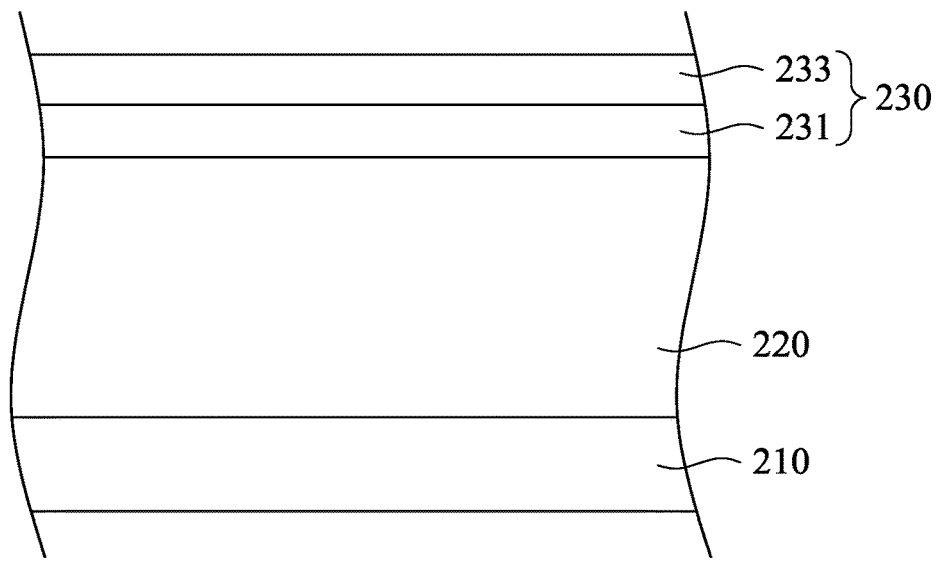
FIG. 2A-FIG. 2L are schematic cross-sectional views of intermediate stages showing a method for forming a semiconductor structure having a SoC layer with re-entrant profile in accordance with various embodiments of the present disclosure.

Referring to FIG. 2A-FIG. 2L, FIG. 2A-FIG. 2L are schematic cross-sectional views of intermediate stages showing a method for forming a semiconductor structure having a SoC layer with a re-entrant profile in accordance with various embodiments of the present disclosure. As shown in FIG. 2A, a semiconductor substrate 210 is provided first. The semiconductor substrate 210 may include Si or any other suitable material.

A SoC layer 220 is formed on the semiconductor substrate 210. In some embodiments, the SoC layer 220 may be formed by a simple spin coating process, in which a carbon-rich material is deposited on the semiconductor substrate 210 by spin coating, followed by subjecting the semiconductor substrate 210 to a bake operation under 180° C.-370° C. for 60 seconds-180 seconds, so as to form the SoC layer 220. For example, the bake operation may be performed under 180° C. for several tens of seconds first, and then performed under 370° C. for another several tens of seconds for a complete cross-link. In some embodiments, the carbon-rich material may include 85 wt. % 90 wt. % of carbon, and 10 wt. %-15 wt. % of oxygen and hydrogen.

A hard mask layer 230 is then formed over the SoC layer 220. In some embodiments, the hard mask layer 230 may include a first hard mask layer 231 and a second hard mask layer 233 on the first hard mask layer 231. In one example, the first hard mask layer 231 may be an oxide layer, e.g. silicon dioxide. In other example, the second hard mask layer 233 may be a nitride layer, e.g. silicon nitride. The hard mask layer 230 is formed by depositing the material of the first hard mask layer 231 on the SoC layer 220, followed by depositing the material of the second hard mask layer 233 on the first hard mask layer 231. Depositing the materials of the hard masks may be performed by a physical vapor deposition (PVD), a chemical vapor deposition (CVD) or sputtering.

Figure 2B:
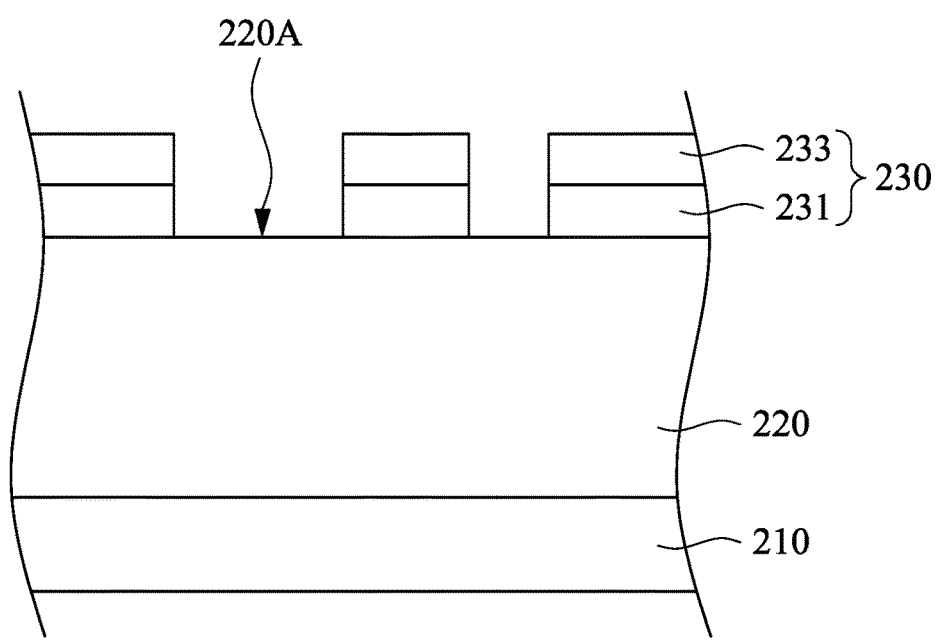

As shown in FIG. 2B, the hard mask layer 230 is patterned to expose a portion 220A of the SoC layer 220. In some embodiments, the hard mask 230 is patterned by a photolithography process which may involve operations such as formation of a photoresist layer (not shown) and etching the hard mask layer 230 by the photoresist layer. The above processes are known in the art and may not be described in detailed herein.

Figure 2C:
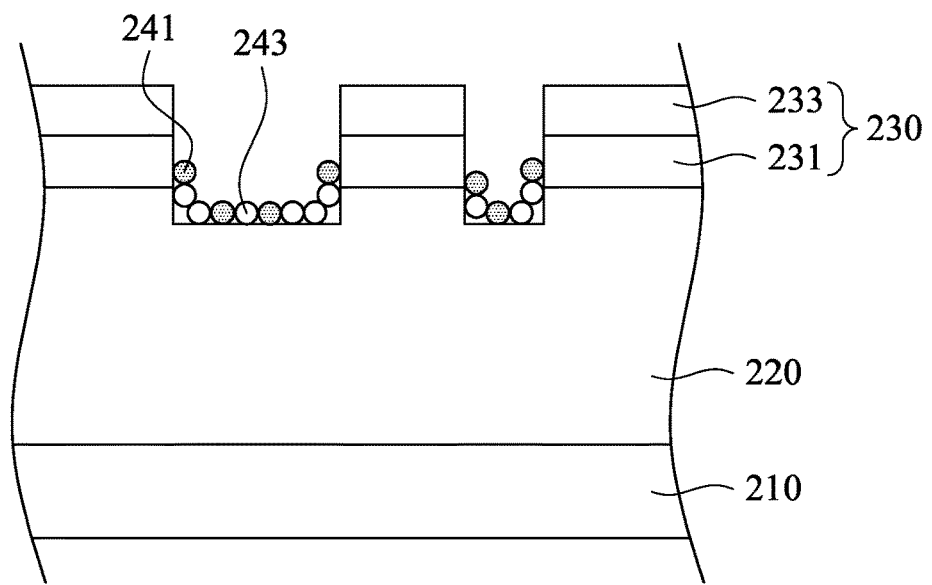
Figure 2D:
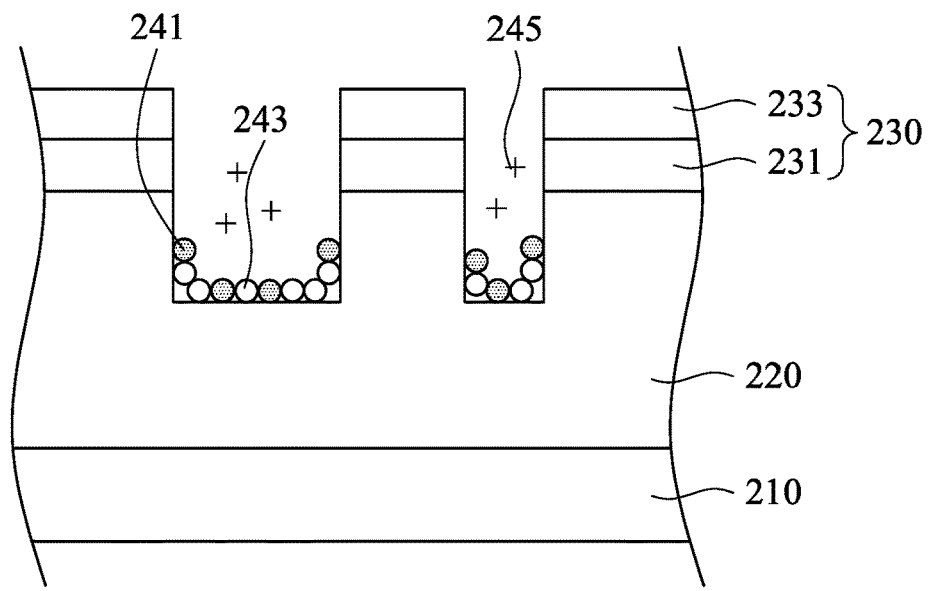
Figure 2E:
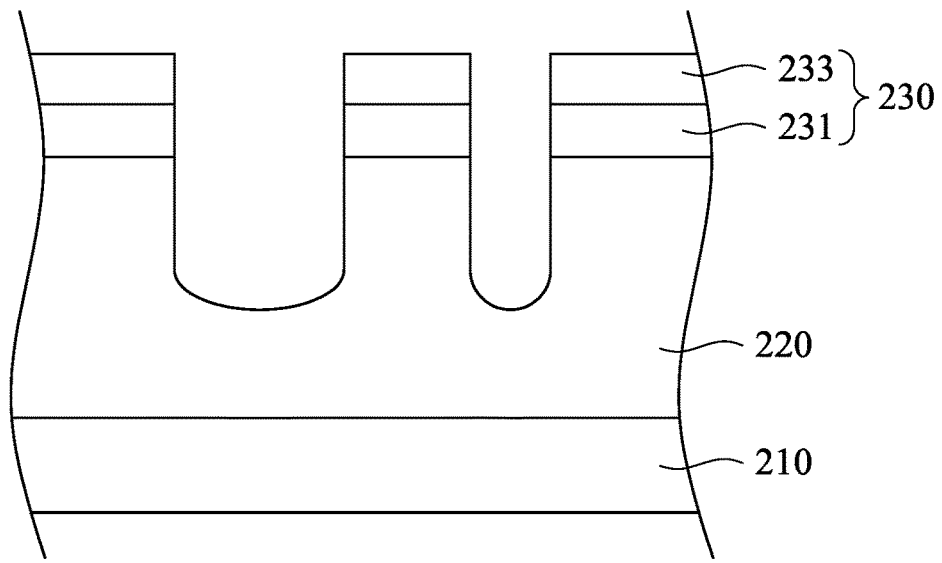

FIG. 2C-FIG. 2L shows schematic cross-sectional views of intermediate stages, of an atomic layer etching (ALE) operation, and two openings 250 (shown in FIG. 2L) are formed on the portion 220A of the SoC layer 220. Referring to FIG. 2C-FIG. 2E, a first cycle of an etching operation is shown therein. In FIG. 2C, a passivation gas 241 and an etching gas 243 are flown over the portion 220A of the SoC layer 220 under a first pressure P1, in which the passivation gas 241 flows at a first flow rate F1 and the etching gas 243 flows at a second flow rate F2. In some embodiments, the passivation gas 241 may include a hydrocarbon gas or a sulfur-containing gas. In one example, the hydrocarbon gas may be methane ($CH_4$), and the sulfur-containing gas may be sulfur dioxide or carbonyl sulfide. In some embodiments, the etching gas 243 may be a mixture of a $N_2$ and $H_2$-based gas, which has higher selectivity (e.g. selectivity greater than 70) to the SAC silicon nitride layer, the oxide hard mask layer and the low k spacer layer than the SoC layer 220. The passivation gas 241 and the etching gas 243 are applied at the same time. It is noted a fluorine-containing gas (e.g. $SF_6$ or $CF_4$) is not used as the passivation gas 241 since the strong etching ability of the fluorine-containing gas may cause an undesired etched profile.

Next, as shown in FIG. 2D, an ionized noble gas bombardment is applied to the portion 220A of the SoC layer 220 at a first temperature T1. The ionized noble gas 245 may be, for example, $Ar^+$. It is noted that the etching gas 243 applied in the FIG. 2C may slightly etch the SoC layer 220, while the etching efficiency is poor. Therefore, the ionized noble gas bombardment is applied to accelerate the etching operation.

A desorption operation may be selectively performed, as shown in FIG. 2E. The desorption operation is aimed at removing by-products and remaining reactive gases (i.e. the passivation gas 241 and the etching gas 243). In some embodiments, the desorption operation may be performed by applying a gas or a gas mixture for purging, etching and/or ashing on the semiconductor structure.

Figure 2F:
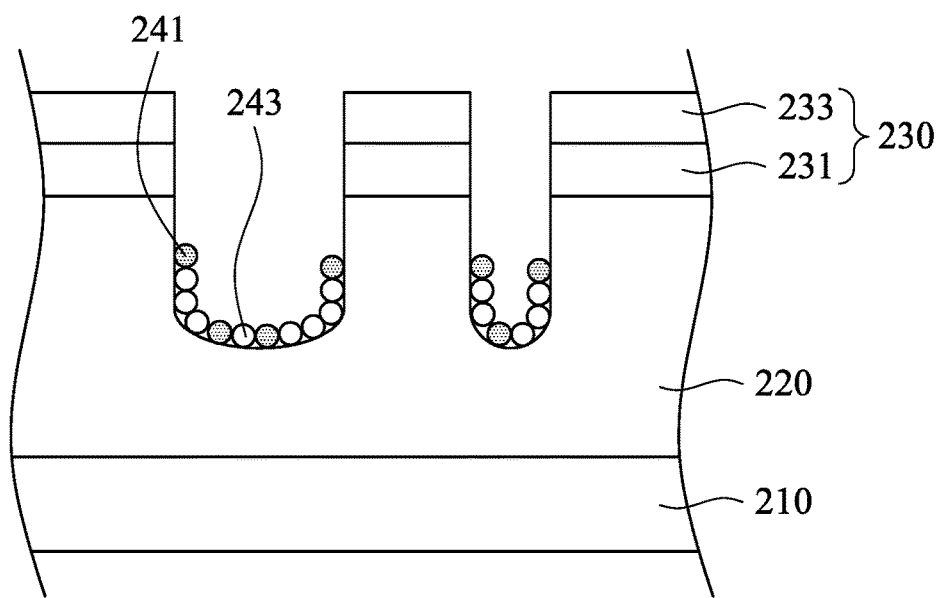
Figure 2G:
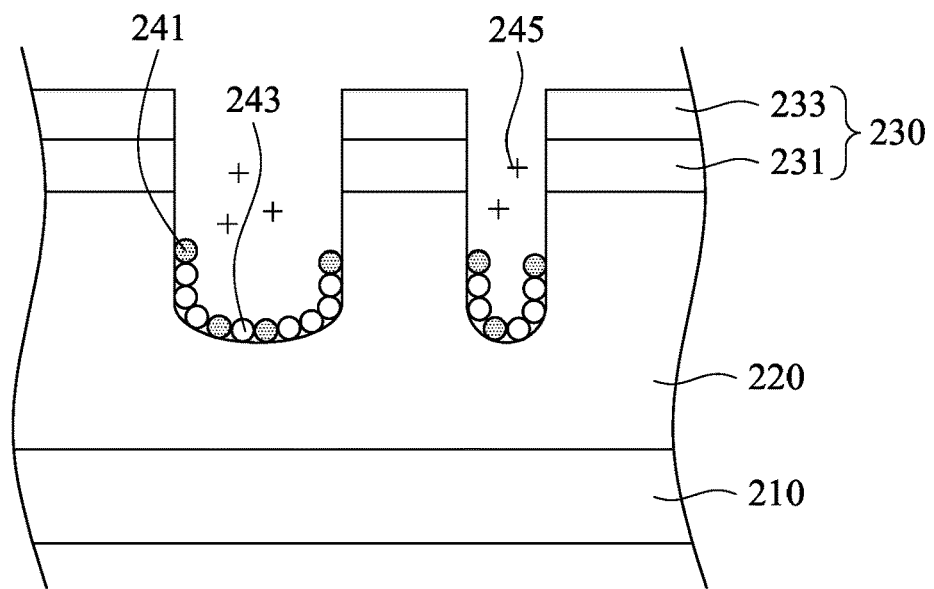
Figure 2H:
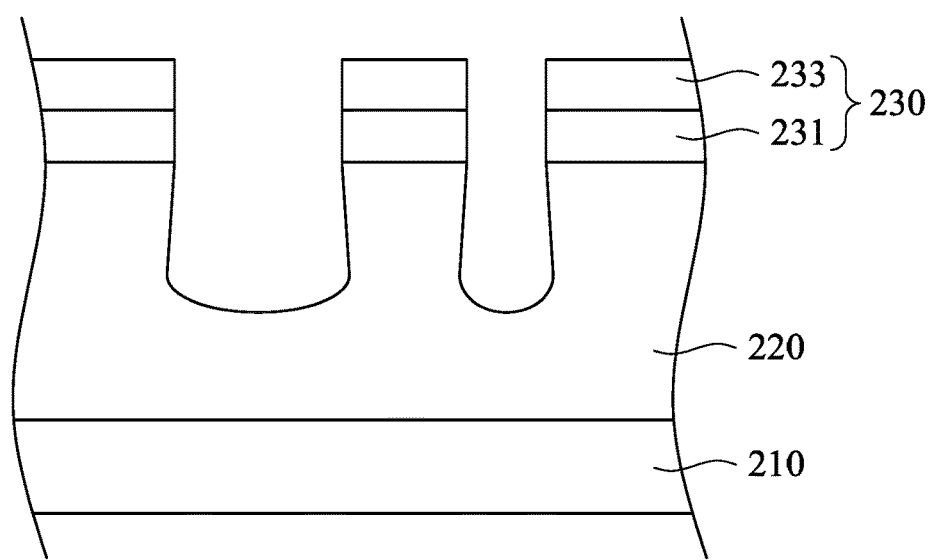

Referring to FIG. 2F-FIG. 2H, a second cycle of the etching operation is shown therein. In FIG. 2E, the passivation gas 241 and the etching gas 243 are flown over the portion 220A of the SoC layer 220 under a second pressure P2, in which the flow rate of the passivation gas 241 decreases to a third flow rate F3 from the first flow rate F1, and the flow rate of the etching gas 243 increases to a fourth flow rate F4 from the second flow rate F2. The examples of the passivation gas 241 and the etching gas 243 are same as mentioned in FIG. 2C, and may not be repeated herein.

Next, as shown in FIG. 2G, the ionized noble gas bombardment is applied to the portion 220A of the SoC layer 220, and the temperature of the ionized noble gas bombardment operation increases to a second temperature T2 from the first temperature T1. Likewise, the desorption operation may be selectively performed to remove by-products and remaining reactive gases, as shown in FIG. 2H.

Figure 2I:
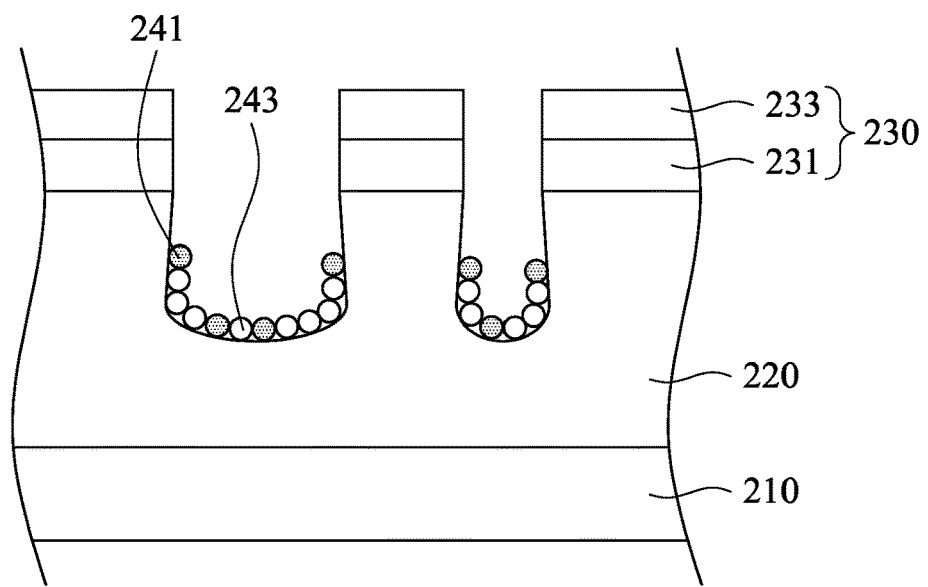
Figure 2J:
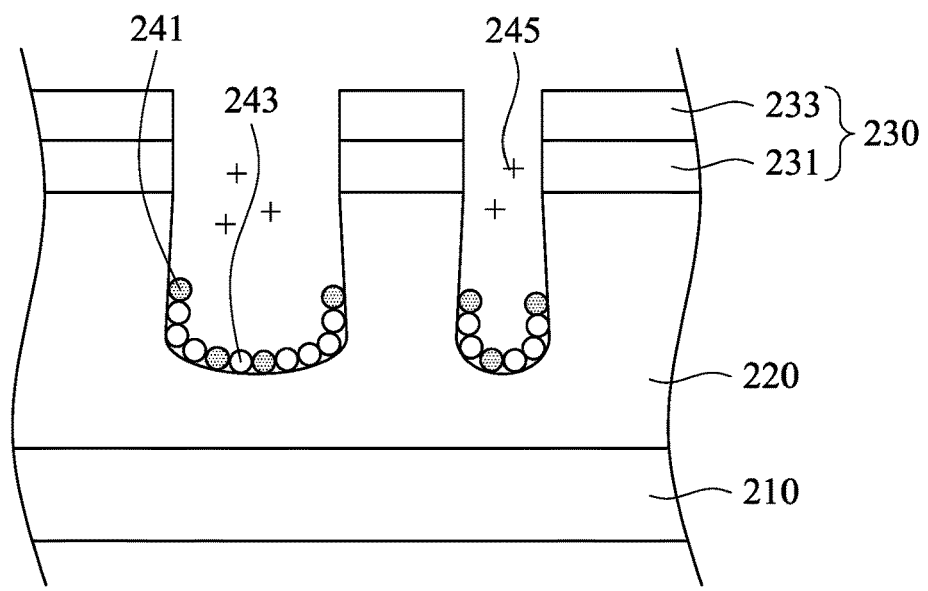
Figure 2K:
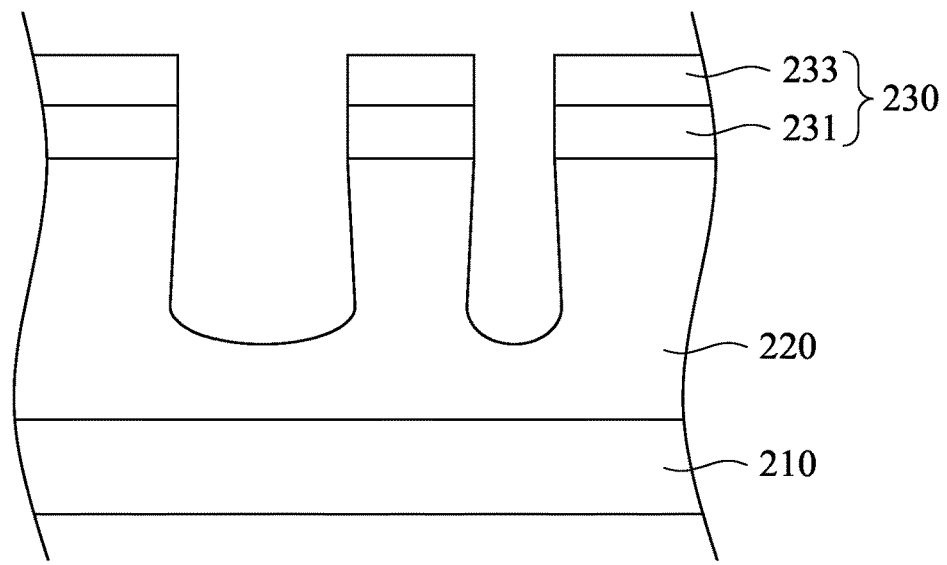

Referring to FIG. 2I-FIG. 2K, a third cycle of the etching operation is shown therein. In FIG. 2I, the passivation gas 241 and the etching gas 243 are flown over the portion 220A of the SoC layer 220 under a third pressure P3, in which the flow rate of the passivation gas 241 decreases to a fifth flow rate F5 from the third flow rate F3, and the flow rate of the etching gas 243 increases to a sixth flow rate F6 from the fourth flow rate F4. The examples of the passivation gas 241 and the etching gas 243 are same as mentioned in FIG. 2C, and may not be repeated herein.

Next, as shown in FIG. 2J, the ionized noble gas bombardment is applied to the portion 220A of the SoC layer 220, and the temperature of the ionized noble gas bombardment increases to a third temperature T3 from the second temperature T2. Likewise, the desorption operation may be selectively performed to remove by-products and remaining reactive gases, as shown in FIG. 2K.

The ALE operation shown in FIG. 2C FIG. 2K satisfies the following relationships: P1<P2<P3; F1>F3>F5; F2<F4<F6; and T1<T2<T3. In some embodiments, the first pressure P1, the second pressure P2 and the third pressure P3 are in a range substantially from 3 mtorr to 800 mtorr. In some embodiments, the first temperature T1, the second temperature T2 and the third temperature T3 are in a range substantially from 0° C. to 100° C. In further embodiments, a temperature difference between the first temperature T1 and the second temperature T2, and/or between the second temperature T2 and the third temperature T3 is at least 5° C. In some embodiments, the first pressure P1 is not higher than 20 mtorr.

In some embodiments, the ALE operation may include a plurality of the first cycles, a plurality of the second cycles and/or a plurality of the third cycles, and the second cycles are performed after all of the first cycles are finished, and the third cycles are performed after all of the second cycles are finished.

The operation conditions such as the pressure, the flow rates, and the temperature in each different cycle of the etching operation of the ALE operation are adjusted gradually (i.e. the relationships mentioned above), so as to change a rate and a direction of the etching operation, thereby obtaining a desired profile of the SoC layer 220. In particular, when the pressure in the gases-flowing operation is equal to or less than 20 mtorr, a vertical etching is more dominant than a lateral etching. In some embodiments, the vertical etching is mainly performed in the first cycle of the etching operation shown in FIG. 2C-FIG. 2E. On the other hand, when the pressure in the gases-flowing operation is greater than 20 mtorr, the lateral etching is more dominant than the vertical etching. In some embodiments, the lateral etching is mainly performed in the second and the third cycles of the etching operation shown in FIG. 2F-FIG. 2K, leading to the openings 250 having a bottom with a greater width shown in FIG. 2L.

Furthermore, the passivation gas 241 passivates a surface of the SoC layer 220, thereby decreasing the etching rate of the etching operation. Therefore, the etching rate and the profile of the semiconductor structure may be further controlled by adjusting the flow rates of the passivation gas 241 and the etching gas 243. Generally, the flow rate of the passivation gas 241 gradually decreases and the flow rate of the etching gas 243 gradually increases to enlarge a bottom of the openings 250, so as to form the re-entrant profile of the SoC layer 220.

It is appreciated that the pressure, the temperature and the flow rates may be adjusted depending on the desired profile, for example, both of the pressure of the first and the second cycles may be less than 20 mtorr in other embodiments. The embodiment in the present disclosure is shown for clearance, and the present disclosure is not limited to the disclosed embodiment.

Furthermore, when the temperature difference between the first temperature T1 and the second temperature T2, and/or between the second temperature T2 and the third temperature T3 is less than 5° C., the SoC layer 220 having the re-entrant profile may not be formed.

In some embodiments, after the third cycle of the etching operation shown in FIG. 2I-FIG. 2K is finished, the ALE operation further includes one or more cycles of the etching operation, and each cycle has a lower passivation gas flow rate, a higher etching gas flow rate, a higher temperature and a higher pressure than a cycle prior thereto.

Figure 2L:
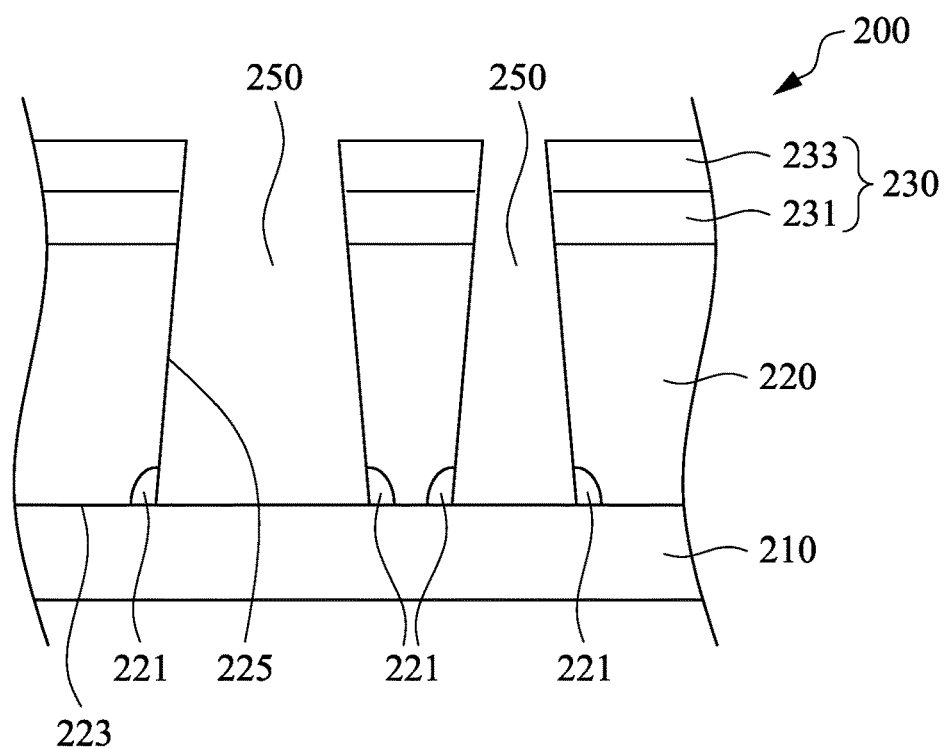

As shown in FIG. 2L, after the ALE operation is performed, a semiconductor structure 200 with the openings 250 having a trapezoid shape is formed, and the SoC layer 220 adjacent to the openings 250 has a re-entrant profile with a re-entrant angle 221 included between a bottom 223 of the SoC layer 220 and a sidewall 225 of the SoC layer 220. In some embodiments, the re-entrant angle 221 is greater than 90°.

Figure 3:
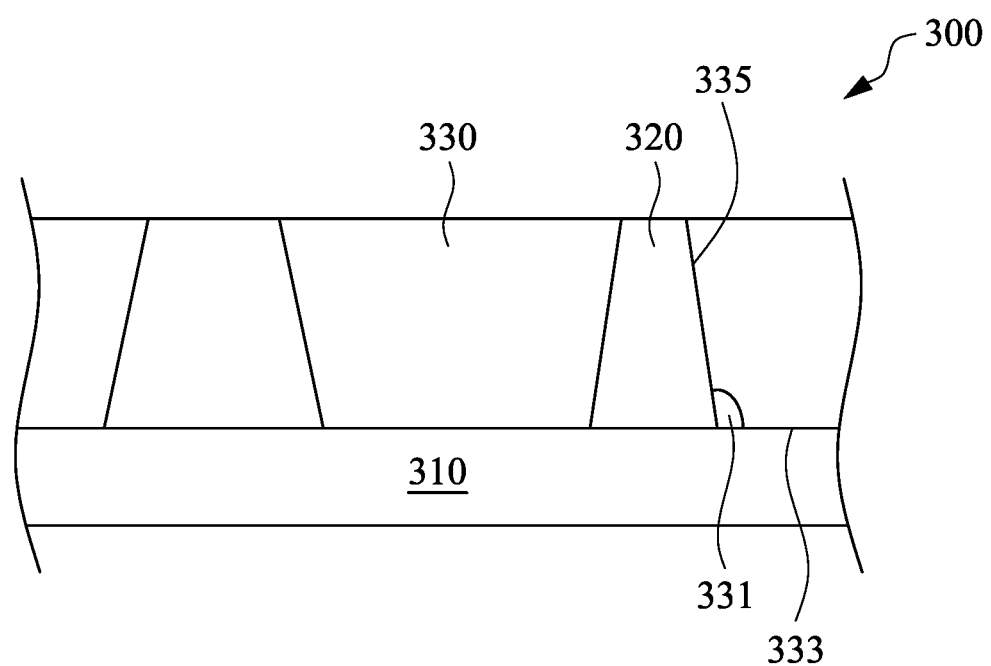
FIG. 3 is a schematic cross-sectional view of a semiconductor structure having a metal layer with a re-entrant profile.

FIG. 3 is a schematic cross-sectional view of a semiconductor structure having a metal layer with a re-entrant profile. As shown in FIG. 3, a semiconductor structure 300 includes a semiconductor substrate 310, an inter-layer dielectric (ILD) layer 320 and a metal layer 330. The ILD layer 320 is disposed on the semiconductor substrate 310. The metal layer 330 is disposed in the ILD layer 320 and on the semiconductor substrate 310. The metal layer 330 has a reverse-trapezoid profile, and a re-entrant angle 331 is included between one of sidewalls 335 of the metal layer 330 and a bottom 333 of the metal layer 330. In some embodiments, the re-entrant angle 331 is greater than 90°.

Figure 4A:
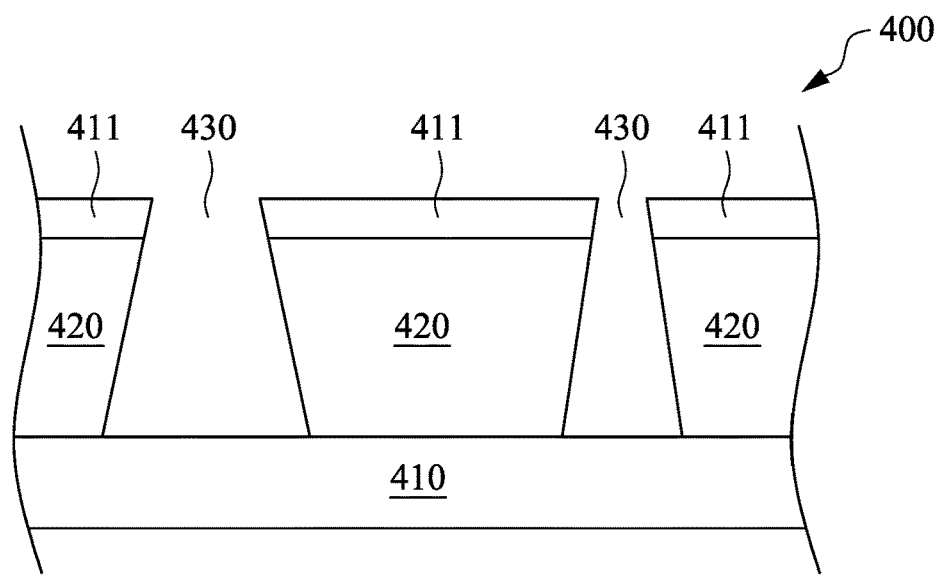
FIG. 4A-FIG. 4D are schematic cross-sectional views of intermediate stages showing a method for forming a semiconductor structure having a metal layer with re-entrant profile in accordance with various embodiments of the present disclosure.

Referring to FIG. 4A-FIG. 4D, FIG. 4A-FIG. 4D are schematic cross-sectional views of intermediate stages showing a method for forming a semiconductor structure having a metal layer with a re-entrant profile in accordance with various embodiments of the present disclosure. As shown in FIG. 4A, a semiconductor structure 400 is provided first. The semiconductor structure 400 includes a semiconductor substrate 410, a hard mask layer 411, a SoC layer 420 and two openings 430. The method of forming the semiconductor structure 400 in FIG. 4A is similar to the method of the semiconductor structure 200 in FIG. 2L. It is noted that only one layer is shown in the hard mask layer 411 for simplifying the figures, while the hard mask layer 411 may be same as the hard mask layer 230 shown in FIG. 2L, which is a two-layered structure.

Briefly, the semiconductor substrate 410 is provided first, and the unetched SoC layer 420 and an un-patterned hard mask layer 411 are sequentially formed on/over the semiconductor substrate 410, followed by the hard mask patterning operation to expose a portion of the SoC layer 420 and the ALE operation to form the openings 430 on the portion of the SoC layer 420. The ALE operation includes a first cycle, a second cycle and a third cycle of an etching operation, in which each of the cycles includes operations of flowing a passivation gas and an etching gas over the portion of the SoC layer 420 and performing an ionized noble gas bombardment on the portion of the SoC layer 420. In some embodiments, a desorption operation may be performed after the ionized noble gas bombardment. With sequential processing of the first, second and third cycles, a flow rate of the passivation gas decreases, a flow rate of the etching gas increases, a pressure in the operation of flowing the gases increases, and a temperature in the operation of performing the ionized noble gas bombardment increases. The operation conditions such as the temperature, the pressure, and the flow rate, the specific examples of the gases of the ALE operation in the embodiment of FIG. 4A is similar to the operation conditions of the ALE operation in the embodiment of FIG. 2C-FIG. 2K, and may not be repeated herein.

Figure 4B:
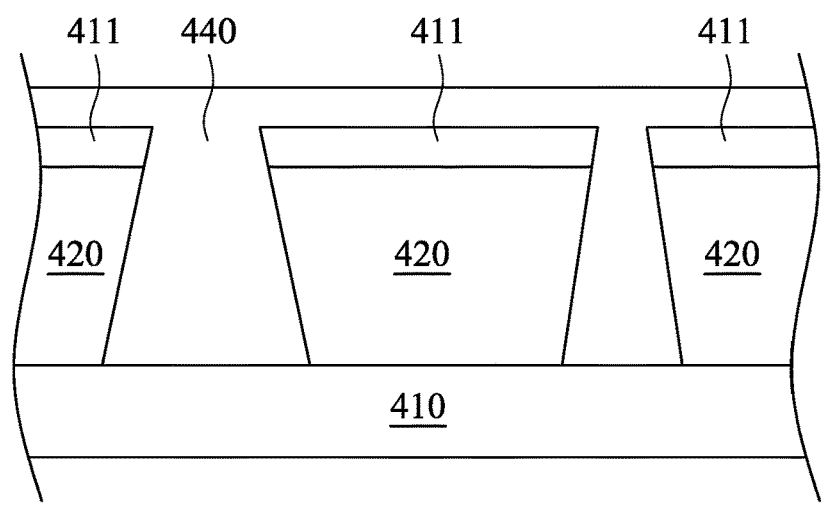

Next, as shown in FIG. 4B, the openings 430 are filled with a dielectric material, thereby forming, for example, a dielectric layer 440. In some embodiments, the dielectric material includes silicon oxide, silicon nitride, silicon oxycarbide (SiOC) or a combination thereof. It is noted that the dielectric material is easier to fill in the openings 430 having the trapezoid shape than a metal material, and forming the dielectric layer (e.g. ILD layer 440) in the openings 430 may improve the metal-filling capability performed in the subsequent operation.

Figure 4C:
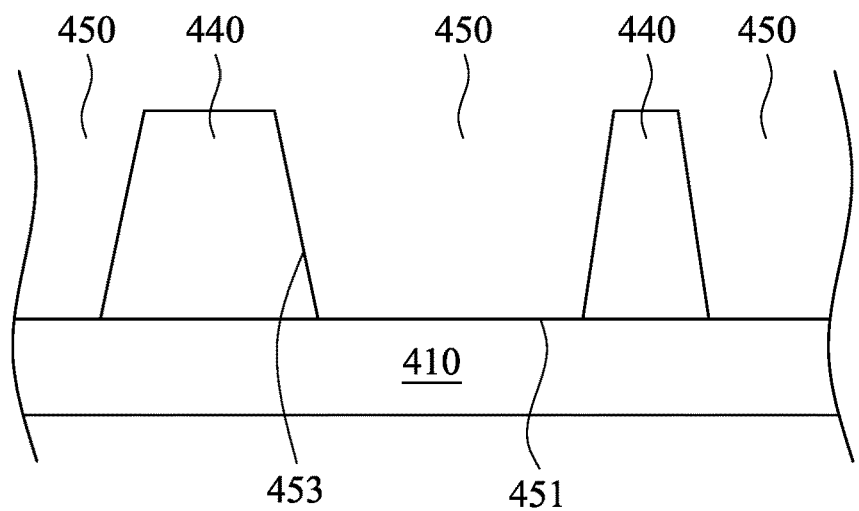

Afterwards the excess dielectric material out of the opening 430 and the hard mask layer 411 may be removed by one or more chemical mechanical polishing (CMP) operations. Then, the SoC layer 420 is removed and three metal-filling spaces 450 are formed, as shown in FIG. 4C. The metal-filling spaces 450 have a re-entrant angle included between a bottom 451 of the metal-filling spaces 450 and a sidewall 453 of the metal-filling spaces 450. In some embodiments, an ash process may be applied to remove the SoC layer 420. In some embodiments, the re-entrant angle is greater than 90°. It is appreciated that the number of the metal-filling spaces 450 may be changed in other embodiments, and it is not limited to the specific number disclosed in the present disclosure.

Figure 4D:
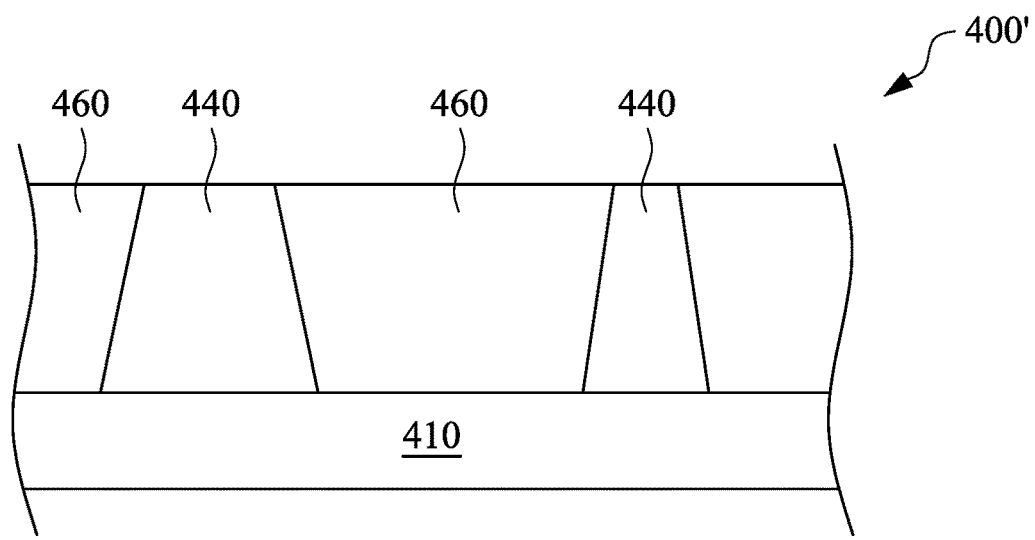

Next, as shown in FIG. 4D, the metal-filling spaces 450 are filled with a metal material, thereby forming a semiconductor structure 400' with a metal layer 460 having the re-entrant profile. The metal material may include a material used to form a metal gate, for example, the metal material may be cobalt or tungsten.

In some embodiments, the semiconductor structure 400' may be a portion of a FinFET device, and the metal-filling operation shown in FIG. 4D may be a contact forming operation. It is appreciated that the high selectivity (e.g. selectivity>70) of etching the SoC layer 420 (FIG. 4B) to the SAC layer, the nitride layer, the oxide hard mask layer and the low k spacer layer prevents a gate loss.

In the embodiment where the semiconductor structure 400' is the portion of the FinFET device, between the operations shown in FIG. 4B and FIG. 4C, the method may further include operations of an oxide deposition performed by flowable CVD, and/or a CMP operation to form other layers or elements for the FinFET device.

Figure 5:
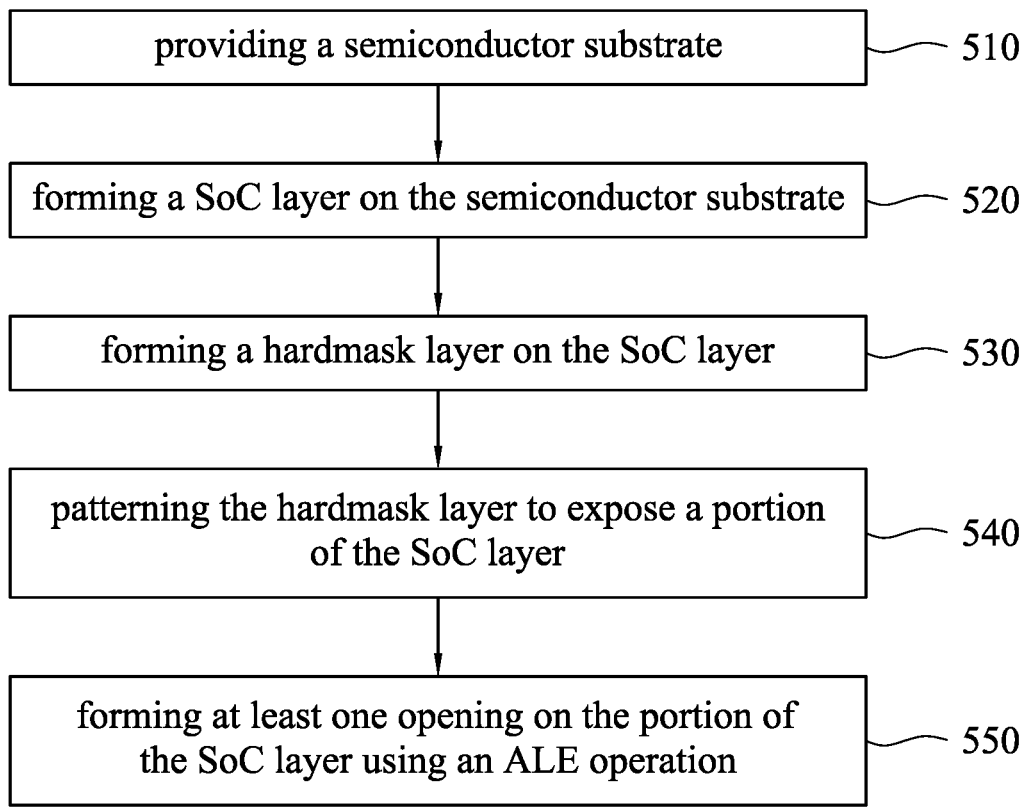
FIG. 5 is a flow chart of a method of forming a semiconductor structure having a SoC layer with a re-entrant profile in accordance with various embodiments of the present disclosure.

Referring to FIG. 5, FIG. 5 is a flow chart of a method of forming a semiconductor structure having a SoC layer with a re-entrant profile in accordance with various embodiments of the present disclosure. FIG. 2A-FIG. 2L are incorporated herein for clearance. In operation 510, a semiconductor substrate is provided. In operation 520, a SoC layer on the semiconductor substrate is formed on the semiconductor substrate. In operation 530, a hardmask layer on the SoC layer is formed on the SoC layer. The structure shown in FIG. 2A is formed by performing the above operations.

In operation 540, the hardmask layer is patterned to expose a portion of the SoC layer, as shown in FIG. 2B. In operation 550, at least one opening on the portion of the SoC layer is formed using an ALE operation. The ALE operation includes several cycles of the etching operation, in which the flow rates of the passivation gas and the etching gas, the pressure of the gases-flowing operation and/or the temperature of the ionized noble gas bombardment are gradually changed cycle to cycle, so as to obtain the desired re-entrant profile of the SoC layer. The detailed descriptions of the ALE operation are described in FIG. 2C-FIG. 2K.

Figure 6:
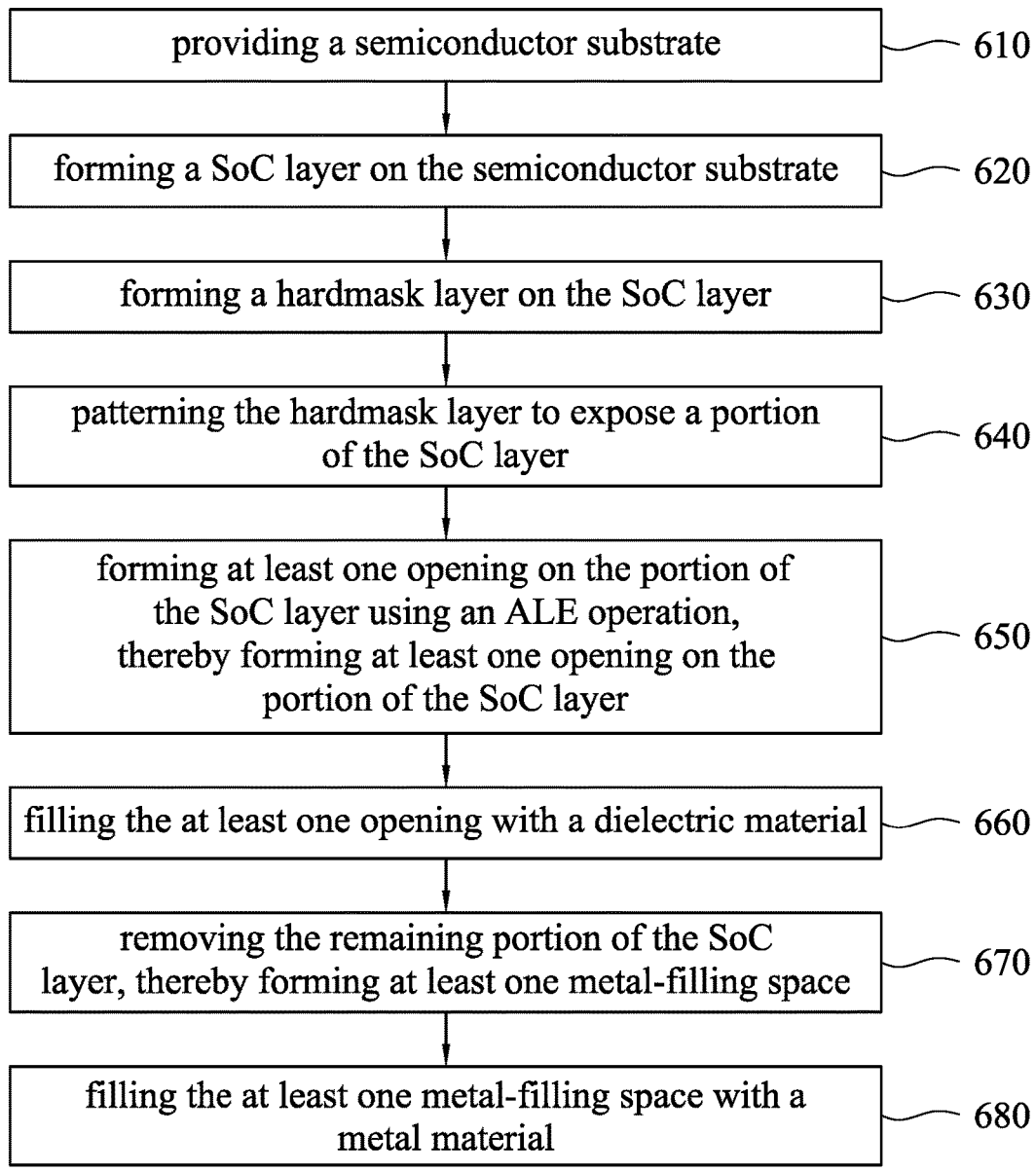
FIG. 6 is a flow chart of a method of forming a semiconductor structure having a metal layer with a re-entrant profile in accordance with various embodiments of the present disclosure.

Referring to FIG. 6, FIG. 6 is a flow chart of a method of forming a semiconductor structure having a metal layer with a re-entrant profile in accordance with various embodiments of the present disclosure. FIG. 2A-FIG. 2L and FIG. 4A-FIG. 4D are incorporated herein for clearance. In operation 610, a semiconductor substrate is provided. In operation 620, a SoC layer on the semiconductor substrate is formed on the semiconductor substrate. In operation 630, a hardmask layer is formed on the SoC layer. The structure shown in FIG. 2A is formed by the above operations.

In operation 640, the hardmask layer is patterned to expose a portion of the SoC layer, as shown in FIG. 2B. In operation 650, at least one opening on the portion of the SoC layer is formed using an ALE operation. The detailed descriptions of the ALE operation may be referred to the descriptions of the operation 550 of FIG. 5 and FIG. 2C-FIG. 2K, and may not be repeated herein.

In operation 660, the at least one opening is filled with a dielectric material, as shown in FIG. 4B. The excess dielectric material out of the opening and the hard mask layer are removed by one or more CMP operations. Then, in operation 670, the remaining portion of the SoC layer is removed, thereby forming at least one metal-filling space, as shown in FIG. 4C. In operation 680, the at least one metal-filling space is filled with a metal material, as shown in FIG. 4D.

The present disclosure provides a semiconductor structure having a layer with a re-entrant profile and a method of forming the same. By adjusting the operation conditions such as the temperature, the pressure, and the flow rates of the reactive gases of the ALE operation, for example, gradually increasing the flow rate of the etching gas, gradually decreasing the flow rate of the passivation gas, gradually increasing the pressure in the gases-flowing operation, and/or gradually increasing the temperature in the ionized noble gas bombardment, the SoC layer and the metal layer with a wider top and a smaller bottom (i.e. the re-entrant profile or a reverse trapezoid profile) may be obtained. In other words, the SoC layer and the metal layer may have the re-entrant angle that is greater than 90°. The formation of the bowing profile is avoided and the re-entrant profile benefits metal filling, especially in the case of a semiconductor structure having a small dimension and high aspect ratio, thereby reducing the loading variation.

According to some embodiments of the present disclosure, a method of forming a semiconductor structure is provided. The method includes the following operations. First, a semiconductor substrate is provided. A SoC layer is formed on the semiconductor substrate. A hard mask layer is formed over the SoC layer. The hard mask layer is patterned to expose a portion of the SoC layer. And at least one opening is formed on the portion of the SoC layer using an ALE operation, thereby enabling the remaining portion of the SoC layer adjacent to the at least one opening to have a re-entrant angle included between a sidewall of the SoC layer and a bottom of the SoC layer. The ALE operation includes performing a first, second and third cycle of an etching operation on the portion of the SoC layer. The first cycle of the etching operation includes flowing a passivation gas over the portion of the SoC layer at a first flow rate F1 and an etching gas over the portion of the SoC layer at a second flow rate F2 under a first pressure P1, and performing an ionized noble gas bombardment on the portion of the SoC layer at a first temperature T1. The second cycle of the etching operation includes flowing the passivation gas over the portion of the SoC layer at a third flow rate F3 and the etching gas over the portion of the SoC layer at a fourth flow rate F4 under a second pressure P2, and performing the ionized noble gas bombardment on the portion of the SoC layer at a second temperature T2. The third cycle of the etching operation includes flowing the passivation gas over the portion of the SoC layer at a fifth flow rate F5 and the etching gas over the portion of the SoC layer at a sixth flow rate F6 under a third pressure P3, and performing the ionized noble gas bombardment on the portion of the SoC layer at a third temperature T3. The ALE operation satisfies the following relationships: P1<P2<P3; F1>F3>F5; F2<F4<F6; and T1<T2<T3.

According to some embodiments of the present disclosure, the hard mask layer includes a first hard mask layer and a second hard mask layer on the first hard mask layer.

According to some embodiments of the present disclosure, the first hard mask layer includes an oxide layer, and the second hard mask layer includes a nitride layer.

According to some embodiments of the present disclosure, the re-entrant angle is greater than 90°.

According to some embodiments of the present disclosure, after the third cycle of the etching operation, the ALE operation further includes one or more cycles of the etching operation, and each cycle has a lower passivation gas flow rate, a higher etching gas flow rate, a higher temperature and a higher pressure than a cycle prior thereto.

According to some embodiments of the present disclosure, the passivation gas includes a hydrocarbon gas or a sulfur-containing gas, and the etching gas is a mixture of a $N_2$ and $H_2$-based gas.

According to some embodiments of the present disclosure, the first pressure P1, the second pressure P2 and the third pressure P3 are in a range substantially from 3 mtorr to 800 mtorr, and the first temperature T1, the second temperature T2 and the third temperature T3 are in a range substantially from 0° C. to 100° C.

According to some embodiments of the present disclosure, a temperature difference between the first temperature T1 and the second temperature T2, and/or between the second temperature T2 and the third temperature T3 is at least 5° C.

According to some embodiments of the present disclosure, after the ionized noble gas bombardment, each of the first cycle of the etching operation, the second cycle of the etching operation and/or the third cycle of the etching operation includes performing a desorption operation on the portion of the SoC layer.

According to some embodiments of the present disclosure, the first pressure P1 is not higher than 20 mtorr.

According to some embodiments of the present disclosure, a method of forming a semiconductor structure is provided. The method includes the following operations. First, a semiconductor substrate is provided. A SoC layer is formed on the semiconductor substrate. A hard mask layer is formed over the SoC layer. The hard mask layer is patterned to expose a portion of the SoC layer. And at least one opening is formed on the portion of the SoC layer using an ALE operation. The ALE operation includes a first cycle, a second cycle and a third cycle of an etching operation, in which each of the cycles includes operations of flowing a passivation gas and an etching gas over the portion of the SoC layer and performing an ionized noble gas bombardment on the portion of the SoC layer, and in which with sequential processing of the first, second and third cycles, a flow rate of the passivation gas decreases, a flow rate of the etching gas increases, a pressure in the operation of flowing the gases increases, and a temperature in the operation of performing the ionized noble gas bombardment increases. The method further includes filling the at least one opening with a dielectric material, and removing the remaining portion of the SoC layer, thereby forming at least one metal-filling space. A re-entrant angle is included between a bottom of the at least one metal-filling space and a sidewall of the at least one metal-filling space. The method further includes filling the at least one metal-filling space with a metal material.

According to some embodiments of the present disclosure, removing the remaining portion of the SoC layer includes performing an ash process on the remaining portion of the SoC layer.

According to some embodiments of the present disclosure, the passivation gas includes a hydrocarbon gas or a sulfur-containing gas, and the etching gas is a mixture of a $N_2$ and $H_2$-based gas.

According to some embodiments of the present disclosure, the pressure is in a range substantially from 3 mtorr to substantially 800 mtorr, and the temperature is in a range substantially from 0° C. to 100° C.

According to some embodiments of the present disclosure, the ALE operation includes a plurality of the first cycles, a plurality of the second cycles and/or a plurality of the third cycles.

According to some embodiments of the present disclosure, the second cycles are performed after all of the first cycles are finished, and the third cycles are performed after all of the second cycles are finished.

According to some embodiments of the present disclosure, after the third cycle of the etching operation, the ALE operation further includes one or more cycles of the etching operation, and each of the one or more cycles of the etching operation has a lower passivation gas flow rate, a higher etching gas flow rate, a higher temperature and a higher pressure than its previous cycle.

According to some embodiments of the present disclosure, the re-entrant angle is greater than 90°.

According to some embodiments of the present disclosure, a semiconductor structure is provided. The semiconductor structure includes a semiconductor substrate, an ILD layer and a metal layer. The ILD layer is disposed on the semiconductor substrate. The metal layer is disposed in the ILD layer and on the semiconductor substrate. The metal layer has a reverse-trapezoid profile, and a re-entrant angle is included between one of sidewalls of the metal layer and a bottom of the metal layer.

According to some embodiments of the present disclosure, the re-entrant angle is greater than 90°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
   providing a semiconductor substrate;
   forming a spin-on carbon (SoC) layer on the semiconductor substrate;
   forming a hard mask layer over the SoC layer;

patterning the hard mask layer to expose a portion of the SoC layer; and forming at least one opening on the portion of the SoC layer using an atomic layer etching (ALE) operation, thereby enabling the remaining portion of the SoC layer adjacent to the at least one opening to have a re-entrant angle included between a sidewall of the SoC layer and a bottom of the SoC layer, the ALE operation comprising:

performing a first cycle of an etching operation on the portion of the SoC layer, the first cycle of the etching operation including:

flowing a passivation gas over the portion of the SoC layer at a first flow rate F1 and an etching gas over the portion of the SoC layer at a second flow rate F2 under a first pressure P1; and performing an ionized noble gas bombardment on the portion of the SoC layer at a first temperature T1;

performing a second cycle of the etching operation on the portion of the SoC layer, the second cycle of the etching operation including:

flowing the passivation gas over the portion of the SoC layer at a third flow rate F3 and the etching gas over the portion of the SoC layer at a fourth flow rate F4 under a second pressure P2; and performing the ionized noble gas bombardment on the portion of the SoC layer at a second temperature T2; and performing a third cycle of the etching operation on the portion of the SoC layer, the third cycle of the etching operation including:

flowing the passivation gas over the portion of the SoC layer at a fifth flow rate F5 and the etching gas over the portion of the SoC layer at a sixth flow rate F6 under a third pressure P3; and performing the ionized noble gas bombardment on the portion of the SoC layer at a third temperature T3, wherein the ALE operation satisfies the following relationships:

$P1<P2<P3; F1>F3>F5; F2<F4<F6;$ and $T1<T2<T3$.

2. The method of claim 1, wherein the hard mask layer comprises a first hard mask layer and a second hard mask layer on the first hard mask layer.

3. The method of claim 2, wherein the first hard mask layer comprises an oxide layer, and the second hard mask layer comprises a nitride layer.

4. The method of claim 1, wherein the re-entrant angle is greater than 90°.

5. The method of claim 1, wherein after the third cycle of the etching operation, the ALE operation further comprises one or more cycles of the etching operation, and each cycle has a lower passivation gas flow rate, a higher etching gas flow rate, a higher temperature and a higher pressure than those in a cycle prior thereto.

6. The method of claim 1, wherein the passivation gas comprises a hydrocarbon gas or a sulfur-containing gas, and the etching gas is a mixture of a $N_2$ and $H_2$-based gas.

7. The method of claim 1, wherein the first pressure P1, the second pressure P2 and the third pressure P3 are in a range substantially from 3 mtorr to 800 mtorr, and the first temperature T1, the second temperature T2 and the third temperature T3 are in a range substantially from 0° C. to 100° C.

8. The method of claim 1, wherein a temperature difference between the first temperature T1 and the second temperature T2, and/or between the second temperature T2 and the third temperature T3 is at least 5° C.

9. The method of claim 1, wherein after the ionized noble gas bombardment, each of the first cycle of the etching operation, the second cycle of the etching operation and/or the third cycle of the etching operation comprises performing a desorption operation on the portion of the SoC layer.

10. The method of claim 1, wherein the first pressure P1 is not higher than 20 mtorr.

11. A method of forming a semiconductor structure, the method comprising:

providing a semiconductor substrate;

forming a SoC layer on the semiconductor substrate;

forming a hard mask layer over the SoC layer;

patterning the hard mask layer to expose a portion of the SoC layer;

performing an ALE operation on the portion of the SoC layer, thereby forming at least one opening on the portion of the SoC layer, wherein the ALE operation comprises a first cycle, a second cycle and a third cycle of an etching operation, wherein each of the cycles includes operations of flowing a passivation gas and an etching gas over the portion of the SoC layer and performing an ionized noble gas bombardment on the portion of the SoC layer, and wherein with sequential processing of the first, second and third cycles, a flow rate of the passivation gas decreases, a flow rate of the etching gas increases, a pressure in the operation of flowing each of the gases increases, and a temperature in the operation of performing the ionized noble gas bombardment increases;

filling the at least one opening with a dielectric material;

removing a remaining portion of the SoC layer, thereby forming at least one metal-filling space, wherein a re-entrant angle is included between a bottom of the at least one metal-filling space and a sidewall of the at least one metal-filling space; and filling the at least one metal-filling space with a metal material.

12. The method of claim 11, wherein removing the remaining portion of the SoC layer comprises performing an ash process on the remaining portion of the SoC layer.

13. The method of claim 11, wherein the passivation gas comprises a hydrocarbon gas or a sulfur-containing gas, and the etching gas is a mixture of a $N_2$ and $H_2$-based gas.

14. The method of claim 11, wherein the pressure is in a range substantially from 3 mtorr to substantially 800 mtorr, and the temperature is in a range substantially from 0° C. to 100° C.

15. The method of claim 11, wherein the ALE operation comprises a plurality of the first cycles, a plurality of the second cycles and/or a plurality of the third cycles.

16. The method of claim 15, wherein the second cycles are performed after all of the first cycles are finished, and the third cycles are performed after all of the second cycles are finished.

17. The method of claim 11, wherein after the third cycle of the etching operation, the ALE operation further comprises one or more cycles of the etching operation, and each of the one or more cycles of the etching operation has a lower passivation gas flow rate, a higher etching gas flow rate, a higher temperature and a higher pressure than those in its previous cycle respectively.

18. The method of claim 11, wherein the re-entrant angle is greater than 90°.

19. An etching method, comprising:
providing a semiconductor substrate on which a SoC layer and a hard mask layer are formed, wherein a portion of the SoC layer is exposed from the hard mask layer;
performing an etching operation to form at least one opening on the portion of the SoC layer, wherein the etching operation comprises:
flowing a passivation gas at a first passivation gas flow rate and an etching gas at a first etching gas flow rate over the portion of the SoC layer at a first pressure and performing an ionized noble gas bombardment on the portion of the SoC layer for a vertical-dominant etching operation; and
flowing the passivation gas at a second passivation gas flow rate and the etching gas at a second etching gas flow rate over the portion of the SoC layer at a second pressure and performing the ionized noble gas bombardment on the portion of the SoC layer for a lateral-dominant etching operation,
wherein the first passivation gas flow rate is greater than the second passivation flow rate, the first etching gas flow rate is less than the second etching gas flow rate, and the first pressure is less than the second pressure.

20. The etching method of claim 19, wherein a portion of the semiconductor substrate is exposed from the at least one opening after the etching operation.

* * * * *